United States Patent [19]

Yamaguchi

[11] Patent Number: 4,471,290
[45] Date of Patent: Sep. 11, 1984

[54] SUBSTRATE BIAS GENERATING CIRCUIT

[75] Inventor: Kazuo Yamaguchi, Yokohama, Japan

[73] Assignee: Tokyo Shibaura Denki Kabushiki Kaisha, Japan

[21] Appl. No.: 382,091

[22] Filed: May 26, 1982

[30] Foreign Application Priority Data

Jun. 2, 1981 [JP] Japan ................................ 56-84593

[51] Int. Cl.³ ........................ H03L 1/00; H03K 3/353
[52] U.S. Cl. .................................. 323/274; 307/297; 307/200 B; 307/304
[58] Field of Search ..................... 363/59-62, 363/127; 323/274, 284; 307/296 R, 297, 304, 200 B

[56] References Cited

U.S. PATENT DOCUMENTS

| | | | |
|---|---|---|---|
| 3,806,741 | 4/1974 | Smith | 307/304 |
| 4,142,114 | 2/1979 | Green | 307/304 |
| 4,266,151 | 5/1981 | Hoffmann et al. | 307/297 |
| 4,322,675 | 3/1982 | Lee et al. | 307/297 X |
| 4,344,121 | 8/1982 | Weber | 363/60 X |
| 4,388,537 | 6/1983 | Kanuma | 307/296 R |

FOREIGN PATENT DOCUMENTS 2812378 9/1979 Fed. Rep. of Germany .
50-24054 3/1975 Japan .

OTHER PUBLICATIONS

Martino et al., "An On-Chip Back Bias Generator for MOS Dynamic Memory", IEEE Journal of Solid-State Circuits, vol. SC-15, No. 5, (Oct. 1980), pp. 820-825.
"Fast Mostek ROM Has 350-ns Access", Electronics Magazine, Sep. 16, 1976, pp. 42 and 43.

Primary Examiner—Peter S. Wong
Attorney, Agent, or Firm—Finnegan, Henderson, Farabow, Garrett & Dunner

[57] ABSTRACT

A substrate bias generating circuit includes an oscillator circuit having a control terminal and a bias generating circuit for generating a negative substrate bias voltage responsive to the output signal of the oscillator circuit. The substrate bias generating circuit further includes a voltage divider connected between the output terminal of the bias generating circuit and a ground terminal, and a level sensor for producing a control signal to the oscillator circuit when it is detected that the output voltage of the voltage divider reaches a predetermined value, to thereby stop the oscillating operation of the oscillator circuit.

12 Claims, 12 Drawing Figures

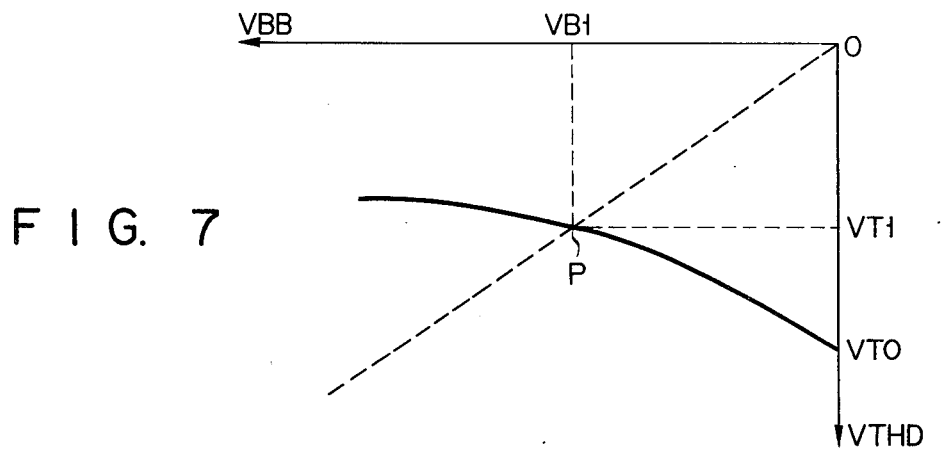
F I G. 7
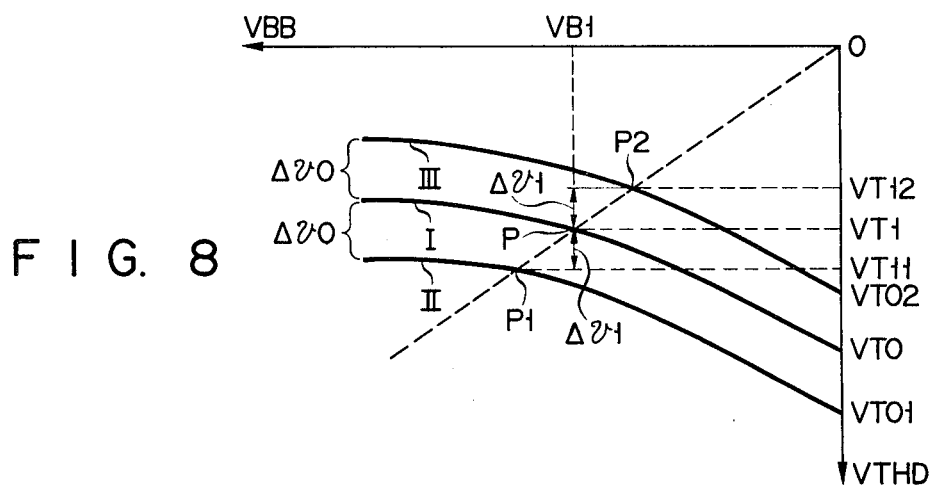
F I G. 8
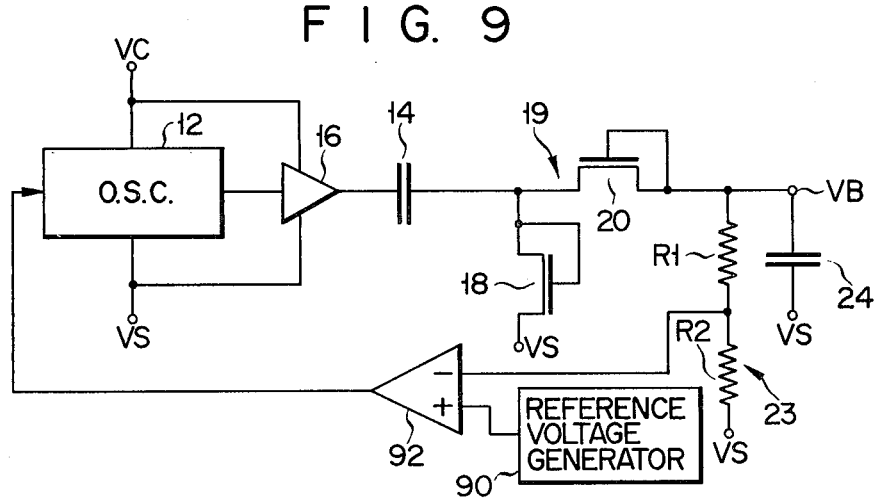
F I G. 9

SUBSTRATE BIAS GENERATING CIRCUIT

BACKGROUND OF THE INVENTION

The present invention relates to a substrate bias generating circuit for applying a predetermined bias to a semiconductor substrate.

Integrated circuits, e.g., one chip central processing unit (CPU) or a random access memory (RAM), etc. employing p-type semiconductor substrate and internally containing a substrate bias generating circuit, have recently found increasing use. When such a substrate bias generating circuit is associated with an integrated circuit in this manner, for example, the capacitance of a junction capacitor formed between the substrate and a diffused region formed in the surface region of the substrate can be reduced, a substrate injection current from localized forward biasing of diodes can be eliminated, and the variation of the threshold voltage of an MOS transistor formed in the substrate due to its source body effect can be minimized.

FIG. 1 shows a conventional substrate bias generating circuit. This substrate bias generating circuit has a ring oscillator 2, a capacitor 4 connected at one end to the output terminal of the ring oscillator 2 through a buffer circuit 6, an n-channel MOS transistor 8 connected at its drain and gate to the other end of the capacitor 4 and also connected at its source to a ground terminal VS, and an n-channel MOS transistor 10 connected at its source to the output end of the capacitor 4 and also connected at its drain and gate to a substrate bias terminal VB.

When the potential of the other end of the capacitor 4 is positive in this substrate bias generating circuit, a current will flow through the MOS transistor 8, thereby varying the potential at the other end of the capacitor 4 toward a ground or reference potential. At this time negative charge is stored in the capacitor 4. When the output signal from the buffer circuit 6 becomes a low level, the potential at the other end of the capacitor 4 becomes negative. When the substrate potential of this case is higher than the potential at the other end of the capacitor 4 in the level of the threshold voltage ($>0$) of the MOS transistor 10, the negative charge stored in the capacitor 4 is flowed into the substrate, thereby lowering the substrate potential.

In the substrate bias generating circuit in FIG. 1, the substrate bias potential VBB varies proportionally to the power voltage VCC applied to a power voltage terminal VC connected to both the oscillator 2 and the buffer circuit 6. In a case where a load is capacitive, when the power source voltage VCC changes, the substrate bias voltage VBB will resultantly vary, and might disadvantageously cause difficulties, e.g., variations in the threshold voltage of an MOS transistor formed in the substrate, an increase in current consumption, etc. It is thus required, for example, in a RAM in a standby mode that consumption current should be minimized and stored data should be maintained with a lower power voltage. When the power voltage is, however, lowered in the RAM in which a conventional substrate bias generating circuit is internally contained, the absolute value of the substrate bias voltage becomes low, with the result, for example, that the threshold voltage ($>0$) of a depletion type (D-type) MOS transistor formed in the p-type substrate will increase in the negative direction. Consequently, larger leakage current will flow through the D-type MOS transistor, resulting in an increase in its consumption power.

SUMMARY OF THE INVENTION

It is an object of the present invention to provide a substrate bias generating circuit for generating a substantially constant substrate bias voltage without being affected by variations in a power source voltage.

According to one aspect of the present invention, there is provided a substrate bias generating circuit comprising oscillator means having a control terminal, bias generating means for generating one polarity substrate bias voltage in response to the output signal of the oscillator means, voltage generating means for generating a voltage signal not higher than the absolute value of the substrate bias from the bias generating means and varying in a predetermined relation to the substrate bias voltage, and control means for controlling the operation of the oscillator means by applying a control signal to the control terminal of the oscillator means when the output voltage from the voltage generating means is detected to reach a predetermined value.

BRIEF DESCRIPTION OF THE DRAWINGS

FIG. 7 is a graph showing the relationship between the threshold voltage of the input stage MOS transistor of the level sensor shown in FIG. 6 and the substrate bias voltage;

FIG. 8 is a graph showing how distortion caused by a manufacturing error in the threshold voltage of MOS transistors used as the input stage MOS transistor of the level sensor shown in FIG. 6 is suppressed;

FIG. 9 is a circuit diagram of another preferred embodiment of the substrate bias generating circuit according to the present invention;

DETAILED DESCRIPTION OF THE PREFERRED EMBODIMENTS

The present invention will now be described in more detail with reference to the accompanying drawings.

Figure 1:
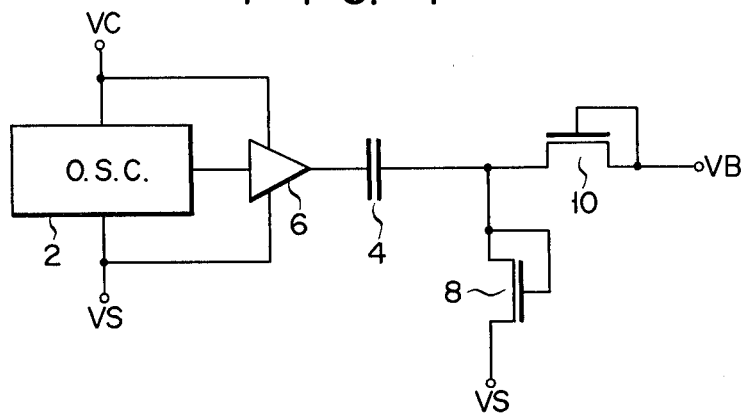
FIG. 1 is a circuit diagram of a conventional substrate bias generating circuit.
Figure 2:
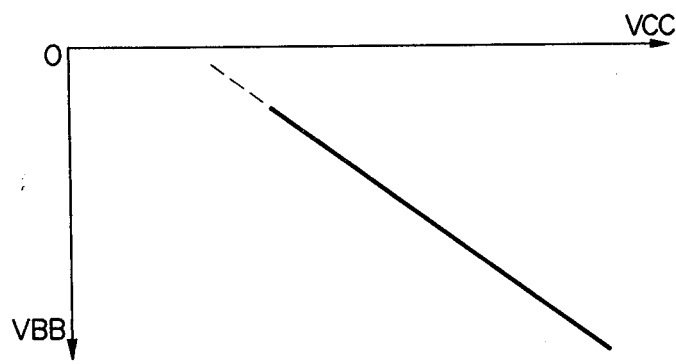
FIG. 2 is a graph showing the relationship between the power source voltage applied to the substrate bias generating circuit shown in FIG. 1 and the substrate bias voltage.
Figure 3:
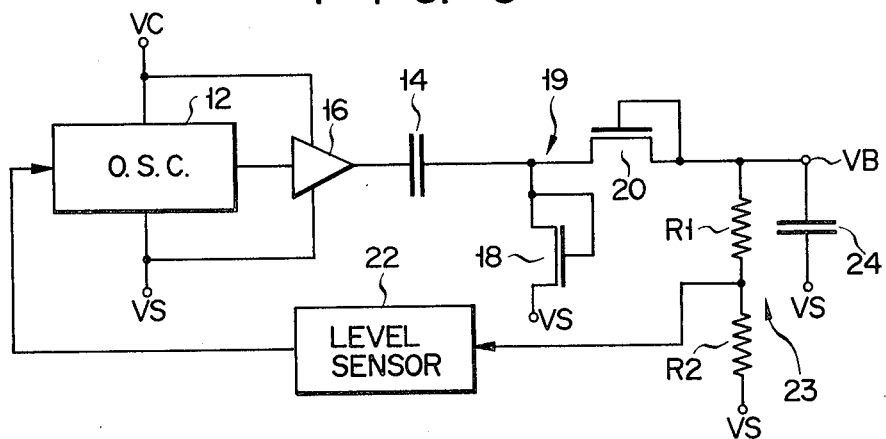
FIG. 3 is a circuit diagram of one preferred embodiment of the substrate bias generating circuit according to the present invention.

FIG. 3 shows one preferred embodiment of the substrate bias generating circuit according to the present invention. This substrate bias generating circuit includes an oscillator circuit 12 driven by a power source voltage VCC supplied between a positive power source terminal VC and a ground terminal VS, a capacitor 14 connected at one end thereof through a buffer circuit 16 to the output terminal of the oscillator 12, an n-channel MOS transistor 18 connected at its drain and gate to the other end of the capacitor 14 and also connected at its source to the ground terminal VS, and and n-channel MOS transistor 20 connected at its source to the other end of the capacitor 14 and also connected at its drain and gate to a substrate bias terminal VB. The substrate bias generating circuit further includes resistors R1 and R2 connected in series between the substrate bias terminal VB and the ground terminal VS, and a level sensor 22 connected at its input terminal to the junction between the resistors R1 and R2 and also connected at its output terminal to the control terminal of the oscillator 12. In FIG. 3, a capacitor 24 represents the parasitic capacitance formed between a grounded interconnection layer (not shown) and the substrate. The buffer circuit 16 may preferably be, for example, formed of a bootstrap circuit having a boosting function.

In FIG. 3, the capacitor 14 and the MOS transistors 18 and 20 cooperatively form a charge pump circuit 19. The resistors R1 and R2 form a voltage divider 23 for supplying an output voltage of VBB/k, where k represents a constant, to the level sensor 22. The level sensor 22 serves to supply a control signal of "1" level to the oscillator 12 when the absolute value of the output voltage VBB/k from the voltage divider 23 becomes equal to a predetermined value VR($>$0) or higher than the VR so as to interrupt the oscillating operation of the oscillator 12. The level sensor 22 further serves to supply a control signal of "0" level to the oscillator 12 when the absolute value of the output voltage VBB/k of the voltage divider 23 becomes lower than the predetermined value VR so as to set the oscillator 12 in the operation mode.

Figure 4:
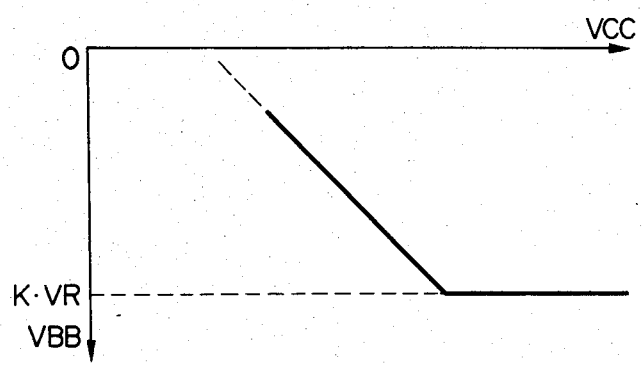
FIG. 4 is a graph showing the relationship between the power source voltage for the substrate bias generating circuit shown in FIG. 3 and the substrate bias voltage.

Assume now that the substrate voltage VBB does not reach a predetermined negative voltage and hence the absolute value of the output voltage VBB/k of the voltage divider 23 is lower than the predetermined value VR. In this case, a "0" level signal is produced from the level sensor 22, the oscillator 12 thus continues the oscillating operation to cause a current flow for maintaining the substrate at a negative potential, and the substrate bias voltage VBB will gradually vary in negative going direction. That is, the absolute value of the voltage VBB will increase. When the voltage VBB reaches the predetermined negative value and the absolute value of the output voltage VBB/k of the voltage divider 23 reaches the predetermined value VR, the level sensor 22 produces a "1" level signal to the oscillator 12 and accordingly stops the oscillating operation of the oscillator 12, thereby interrupting the current flow for maintaining the substrate at the negative potential. In this manner, the substrate potential or the substrate bias voltage VBB can be maintained at the constant value. While the oscillator 12 stops its oscillating operation, the substrate potential will gradually vary in the positive going direction by a leakage current in the substrate and a bias current (discharge current) flowing through the resistors R1 and R2. That is, the absolute value of the substrate bias voltage VBB gradually becomes small. When the absolute value of the output voltage VBB/k of the voltage divider 23 becomes lower than the predetermined value VR in this manner, the level sensor 22 produces the "0" level signal to the oscillator 12, and the oscillator 12 will thus again start oscillating. As a consequence, the substrate potential will again increase in the negative going direction. In this manner, the substrate voltage VBB can be maintained at the constant value k·VR, as shown in FIG. 4, and is substantially unaffected by variations in the power voltage VCC. The gradient of the characteristic curve in FIG. 4 may be varied in accordance with the amplification factor of the buffer circuit 16 shown in FIG. 3.

Figure 5:
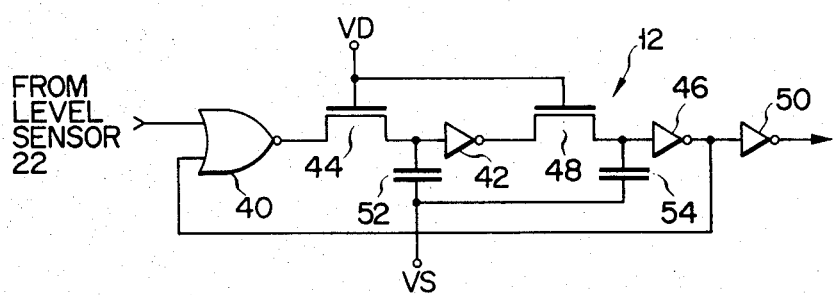
FIG. 5 is a circuit diagram of the oscillator used in the substrate bias generating circuit shown in FIG. 3.

FIG. 5 shows a circuit diagram of the oscillator 12 used in the substrate bias generating circuit shown in FIG. 3. This oscillator 12 has an NOR circuit 40 connected at one input terminal to the level sensor 22, an inverter 42 connected at its input terminal to the NOR circuit 40 through an enhancement type (E-type) MOS transistor 44 operating as an impedance elment, an inverter 46 connected at its input terminal to the inveryter 42 through an E-type MOS transistor 48 and connected at its output terminal to the other input terminal of the NOR circuit 40, and an inverter 50 connectd at its input terminal to the inverter 46. The oscillator 12 further includes capacitors 52 and 54 connected between the respective input terminals of the inverters 42 and 46 and the ground terminal VS. To the gates of the MOS transistors 44 and 48 is connected the power source terminal VD to which a voltage VDD obtained, for example, by dividing the power source voltage VCC, is applied, and the MOS transistors 44 and 48 cooperatively form a delay circuit respectively with the capacitors 52 and 54.

When a "1" level output signal is generated from the level sensor 22 to the NOR circuit 40 of the oscillator 12, the NOR circuit 40 produces a "0" level output signal irrespective of the output signal of the inverter 46, and the oscillator 12 will not thus execute the oscillating operation. When a "0" level output signal is generated from the level sensor 22 to the NOR circuit 40, the NOR circuit 40 operates as an inverter, and the oscillator 12 will execute the oscillating operation.

Figure 6:
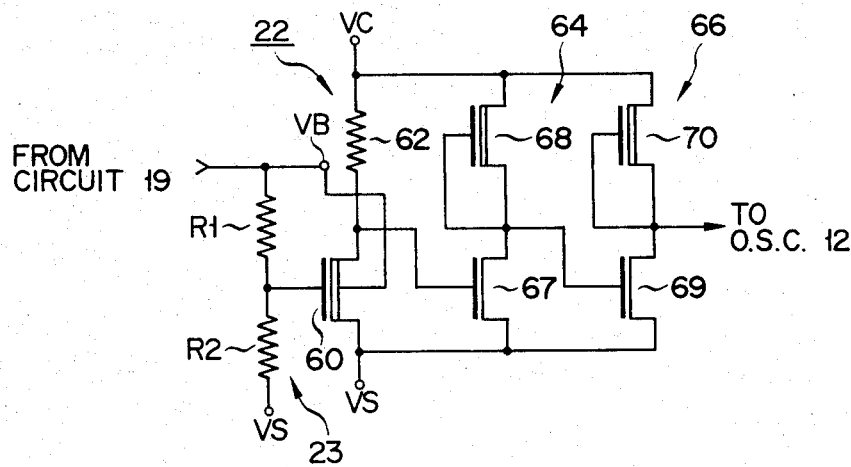
FIG. 6 is a circuit diagram of a voltage divider and level sensor used in the substrate bias generating circuit shown in FIG. 3.

FIG. 6 is a detailed circuit diagram of the level sensor 22 used in the substrate bias generating circuit shown in FIG. 3. This level sensor 22 has a D-type MOS transistor 60 connected at its gate to the output terminal of the voltage divider 23, connected at its source to the ground terminal VS and also connected at its substrate electrode to the substrate bias terminal VB, a resistor 62 connected between the drain of the MOS transistor 60 and the power source terminal VC, an MOS inverter 64 connected at its input terminal to the drain of the MOS transistor 60, and an MOS inverter 66 connected at its input terminal to the output terminal of the MOS inverter 64. The MOS inverter 64 has an E-type MOS transistor 67 connected at its gate to the drain of the MOS transistor 60 and also connected at its source to the ground terminal VS, and a D-type MOS transistor 68 connected at its gate and source to the drain of the MOS transistor 67 and also connected at its drain to the power source terminal VC, and MOS inverter 66 has an E-type MOS transistor 69 connected at its gate to the drain of the MOS transistor 67 and also connected at its source to the ground terminal VS, and a D-type MOS transistor 70 connected at its gate and source to the drain of the MOS transistor 69 and also connected at its drain to the power source terminal VC. The drain of the MOS transistor 69 is connected to the oscillator 12, and the drain voltage of the MOS transistor 69 is supplied as a control signal to the NOR circuit 40 of the oscillator 12.

In the circuit of the level sensor 22 shown in FIG. 6, the absolute value of the threshold voltage VTHD of the MOS transistor 60 is used as the predetermined value VR. When the absolute value of the substrate voltage VBB is lower than the desired value and hence when the absolute value |VBB/k| of the output voltage of the voltage divider 23 is lower than the absolute value |VTHD| of the threshold voltage of the MOS transistor 60, the MOS transistor 60 is in the conductive state, and a "0" level signal is supplied to the inverter 64, with the result that the inverter 66 will supply a "0" level signal to the oscillator 12. Accordingly, the oscillator 12 continues the oscillating operation, and hence the potential at the substrate bias terminal VB gradually varies in the negative going direction. When the absolute value of the substrate bias voltage VBB reaches the predetermined value and hence when the absolute value |VBB/K| of the output voltage of the voltage divider 23 becomes equal to or higher than the absolute value |VTHD| of the threshold voltage of the MOS transistor 60, the MOS transistor 60 becomes nonconductive, and accordingly a "1" level signal is supplied to the inverter 64. Consequently, a "1" level signal is supplied from the inverter 66 to the oscillator 12, and the oscillator 12 will stop its oscillating operation.

Since the substrate of the MOS transistor 60 is connected to the substrate bias terminal VB in this level sensor 22, the threshold voltage VTHD of the MOS transistor 60 will vary in response to the variation in the substrate bias potential VBB, and will be represented by the following equation:

$$VTHD = VT0 + \gamma(\sqrt{|VBB| + 2\phi F} - \sqrt{2\phi F}) \quad (1)$$

where VT0 represents the value of the threshold voltage VTHD when the substrate bias potential VBB is 0 V, $\gamma$ represents a body effect coefficient, and $\phi F$ represents the Fermi potential of the substrate of the MOS transistor 60.

FIG. 7 shows a graph illustrating the relationship between the threshold voltage VTHD represented by the eq. (1) and the substrate bias voltage VBB. In the graph, the abscissa represents the negative substrate bias potential VBB and the ordinate represents the negative threshold voltage VTHD. In the graph, the solid line shows the relationship between VTHD and VBB, and the heavy broken line shows the curve of VTHD=VBB/k and hence the rectilinear line of 1/k of the gradient. At the intersection P of the solid and broken lines, VBB/k=VT1, and the substrate bias potential VBB is equal to the value VB1. Since |VBB/k| is smaller than |VTHD| when the absolute value |VBB| of the substrate bias potential is smaller than |VB1|, the oscillator 12 continues the oscillating operation and allows the substrate bias potential VBB to approach the value VB1. Inasmuch as |VBB/k| is larger than |VTHD| when the absolute value |VBB| of the substrate bias potential is larger than |VB1|, the oscillator 12 will stop oscillating, and allow the substrate bias potential to gradually reduce toward the value VB1 in accordance with the substrate injection current and the like. In this manner, the substrate bias potential VBB reaches the value VB1. The following equation holds under this balanced state:

$$VB1/k = VT0 + \gamma(\sqrt{|VB1| + 2\phi F} - \sqrt{2\phi F}) \quad (2)$$

As evident from the eq. (2), in order to set the substrate bias potential VBB at the desired value VB1, it is only required to set k and VT0 at adequate values.

Then, the influence of an error $\pm \Delta v0$ of the threshold voltage VT0 of the MOS transistor 60 upon the threshold voltage VTHD of the MOS transistor 60 in the balanced state in a case where the MOS transistor 60 is formed to have the threshold voltage VT0 with the error $\pm \Delta v0$ will be described in detail with reference to FIG. 8. In FIG. 8, the heavy broken line represents the curve of VTHD=VBB/k, and the solid lines I, II and III represent the relationship between the threshold voltage VTHD of the MOS transistors having the threshold voltages VT0, VT01 and VT02 at the substrate bias potential VBB=0 V and the substrate bias voltage VBB. Assume that the threshold voltage VT01 and VT02 respectively have errors $-\Delta v0$ and $+\Delta v0$ with respect to the rated threshold voltage VT0 at this time. When the MOS transistors are operated in the balanced state and hence at the stable operation points P, P1 and P2 of the intersections of the solid lines I, II and III and the broken line, the MOS transistors respectively have the threshold voltages VT1, VT11 and VT12. When the MOS transistor having the threshold voltage VT01 whose absolute value is larger than that of the rated threshold voltage VT0 is operated under the balanced state, the substrate bias voltage having the absolute value larger than VB1 is applied and accordingly the threshold voltage VT11 under the balanced state will approach the threshold voltage VT1. That is, the difference $\Delta v1$ between the threshold voltages VT11 and VT1 becomes smaller than the error $\Delta v0$ between the threshold voltages VT01 and VT0. In the MOS transistor having the threshold voltage VT02 whose absolute value is smaller than the rated threshold voltage VT0, difference $\Delta v1$ between the threshold voltages VT12 and VT1 similarly becomes smaller than the error $\Delta v0$ between the threshold voltages VT02 and VT0.

As shown by the eq. (1), the threshold voltage VTHD is a function of the substrate bias potential VBB, and when the relationship between the VTHD and the VBB is approximately represented by a straight line in the vicinity of the stable operation point P, the gradient A of this line can be given by the following equation by differentiating the eq. (1):

$$A = -\frac{\gamma}{\sqrt{2\phi F - VB1}} \quad (3)$$

The following equation is given by the eq. (3) and $$VTHD = \frac{1}{k} VBB \cdot \frac{\Delta v0 - \Delta v1}{k \cdot \Delta v1} = \frac{\gamma}{\sqrt{2\phi F - VB1}} \quad (4)$$

When the eq. (4) is modified, the following equation can be given:

$$\frac{\Delta v1}{\Delta v0} = \frac{1}{1 + \frac{\gamma \cdot k}{\sqrt{2\phi F - VB1}}} \quad (5)$$

As evident from the eq. (5), $\Delta v1/\Delta v0$ becomes smaller than 1.

When $\gamma=0.5$, $2\phi F=0.49$ V, $VB1=-3.2$ V and $k=4/3$ are, for example, set, $\Delta v1/\Delta v0=0.74$ is obtained, and the error is thus reduced by 26%.

When an MOS transistor is ordinarily used as a load element, a current I flowing through the load MOS transistor is approximately proportional to the square of the threshold voltage VTHD of the MOS transistor as is well known in the art. Accordingly, when the error of the threshold voltage of the MOS transistor under the balanced state is reduced as described above, it can suppress the variation in the power source current to an extremely small value.

On the other hand, the threshold voltage VTHE of the E-type MOS transistor is also affected by the influence of the substrate bias potential VBB, but the quantity of the variation in the threshold voltage VTHD due to the substrate body effect can be suppressed to a small value by suitably selecting the impurity density in the substrate region of the E-type MOS transistor, and this problem is not so great.

It is noted that, in a case where the threshold voltage VTHD of the D-type MOS transistor is set, the error of the threshold voltage VTHE of the E-type MOS transistor can be reduced to a small value by first doping the impurity of the quantity for determining the threshold voltage VTHE of the E-type MOS transistor and then the impurity of the quantity more than that of the previous impurity of opposite conductivity type. That is, when the impurity is so doped as to increase the threshold voltage VTHE of the E-type MOS transistor, the threshold voltage VTHD of the D-type MOS transistor is lowered. Therefore, the substrate bias potential becomes lower in a direction to lower the threshold voltage VTHE in the operating state, and the error of the threshold voltage VTHD in the operation state is reduced.

Figure 10:
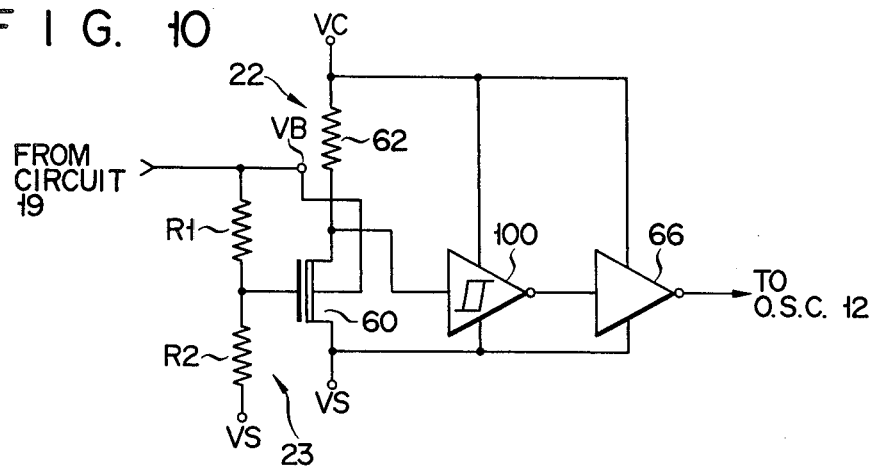
FIG. 10 is a circuit diagram corresponding to the circuit shown in FIG. 6, but including a modified level sensor.
Figure 11:
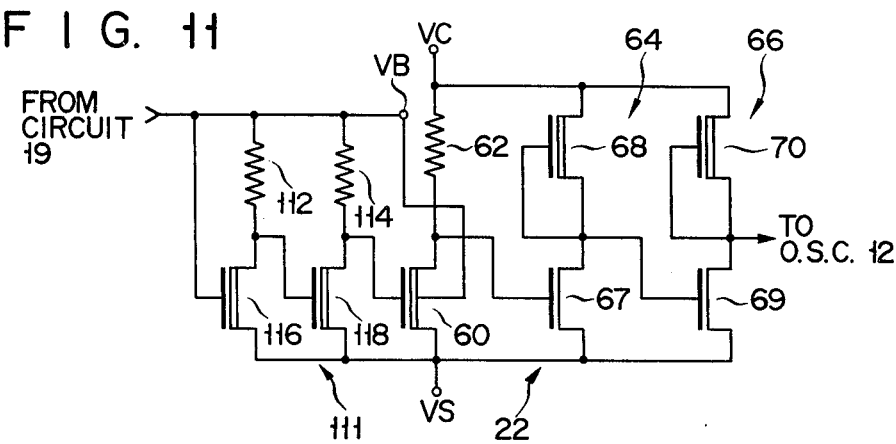
FIGS. 11 and 12 are circuit diagrams corresponding to FIG. 6 but including a differential voltage generating circuit instead of the voltage divider shown in FIG. 6.

The present invention has been described with respect to one preferred embodiment of the substrate bias generating circuit, but the present invention is not limited to the particular embodiment described above. Various other changes and modifications may be made within the spirit and scope of the present invention. For example, as shown in FIG. 9, instead of the level sensor 22 shown in FIG. 3, there can be employed a reference voltage generator 90 for generating a reference voltage VR, and a comparator 92 for comparing the output voltage VBB/k from the voltage divider 23 with the reference voltage VR and supplying a "0" level signal to the oscillator 12 when $|VBB/k|$ is lower than $|VR|$ and a "1" level signal to the oscillator 12 when $|VBB/k|$ is equal to or higher than $|VR|$. Further, a Schmitt inverter 100 having hysteresis characteristic may be used as shown in FIG. 10 instead of the inverter 64 shown in FIG. 6. In the embodiment described above, the divided voltage VBB/k of the substrate bias voltage VBB is supplied from the voltage divider 23 to the level sensor 22 shown in FIG. 3, but it may also, be for example, arranged such that the resistor R1 is short-circuited and the substrate bias voltage VBB can be supplied to the level sensor 22. Moreover, a differential voltage generator 111 shown in FIG. 11 may also be used instead of the voltage divider 23. This differential voltage generator 111 has resistors 112 and 114 connected at their respective one terminals to the substrate bias terminal VB, and D-type MOS transistors 116 and 118 connected in current paths thereof between the ground terminal VS and the other ends of the resistors 112 and 114, respectively. The gate of the MOS transistor 116 is connected to the substrate bias terminal VB, and the gate and drain of the MOS transistor 118 are respectively connected to the drain of the MOS transistor 116 and the gate of the MOS transistor 60. The MOS transistors 116 and 118 are constructed similarly to the MOS transistor 60 and both have threshold voltage VTH equal to the threshold voltage of the MOS transistor 60. When the MOS transistors 116 and 118 are set at the close-to-cutoff state, a gate voltage (VBB-VTH) is applied to the gate of the MOS transistor 118, and a gate voltage (VBB-2VTH) is applied to the gate of the MOS transistor 60. The operation of the oscillator 12 is controlled in response to the magnitude of the gate voltage (VBB-2VTH) and the threshold voltage VTH of the MOS transistor 60. It is noted that the resistor 112 and the MOS transistor 116 may be removed from the voltage generator shown in FIG. 11 and the gate of the MOS transistor 118 may be connected to the substrate bias terminal VB.

Figure 12:
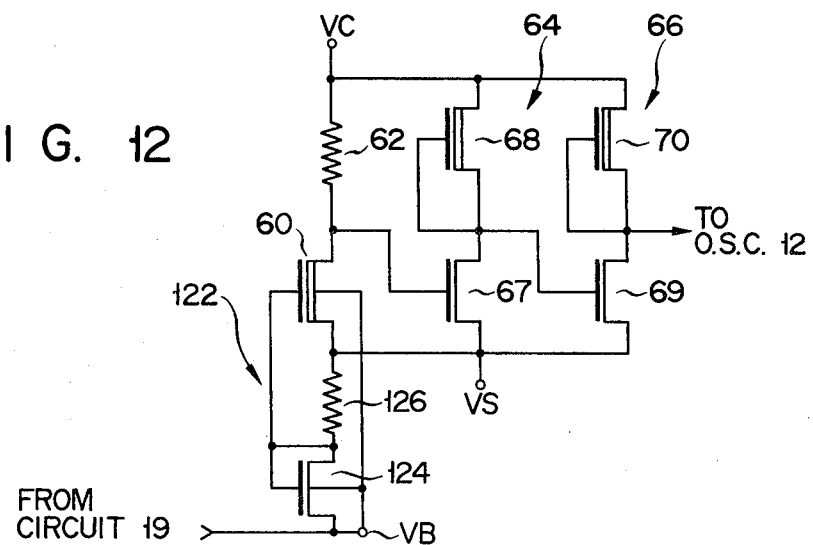

Further, a differential voltage generator 122 shown in FIG. 12 may be used instead of the voltage divider 23. This differential voltage generator 122 has an E-type MOS transistor 124 connected at its gate and drain to the gate of the MOS transistor 60 and also connected at its source to the substrate bias terminal VB, and a resistor 126 connected at its one end to the gate and drain of the MOS transistor 124 and also connected at the other end thereof to the ground terminal VS. The gate voltage (VBB+VTHE), where the VTHE represents the threshold voltage of the MOS transistor 124, is applied to the gate of the MOS transistor 60 in the difference voltage generator 122, and the operation of the oscillator 12 is thus controlled in response to the magnitude of gate voltage (VBB+VTHE) and the threshold of the MOS transistor 60.

Further, the arrangement of the substrate bias generating circuit for generating the positive substrate bias voltage may also be composed by modifying the polarity of the power source voltage and the channel types of the MOS transistors.

It is also possible to use active load elements such as a D-type MOS transistor having its gate and source connected together, instead of the resistors 112, 114 and 116 which may be formed of polycrystalline silicon resistor or diffusion type resistor. Further, in the embodiment of FIG. 3, for example, an output terminal of the charge pump circuit 19 can be directly connected to an input terminal of the level sensor 22, and the voltage divider 23 can be omitted.

What is claimed is:

1. A substrate bias generating circuit comprising reference potential means and oscillator means having a control terminal;

bias generating means for generating a substrate bias voltage at a first output terminal in response to the output signal of said oscillator means;

voltage generating means connected between said first output terminal and said reference potential means to generate at a second output terminal an output voltage having an absolute value not higher than the absolute value of the substrate bias voltage from said bias generating means and varying in a predetermined relationship with respect to said substrate bias voltage; and control means including depletion-type MOS transistor means connected at the gate thereof to said second output terminal and first resistance means connected in series with the current path of said depletion-type MOS transistor means for controlling the oscillating operation of said oscillator means by applying a control signal to said oscillator control terminal when the output voltage of said voltage generating means reaches a level determined by the voltage threshold of said depletion-type MOS transistor means.

2. A substrate bias generating circuit according to claim 1, wherein said voltage generating means includes a voltage divider having resistance means connected in series between said first output terminal and said reference potential means and generating an output voltage determined by the value of said resistance means.

3. A substrate bias generating circuit according to claim 1, wherein said control means further includes inverter circuit means having an input connected to the junction between said depletion-type MOS transistor means and said first resistance means.

4. A substrate bias generating circuit according to claim 3, wherein said inverter circuit means includes a plurality of series-connected inverters.

5. A substrate bias generating circuit according to claim 4, wherein at least one of said plurality of series-connected inverters has hysteresis characteristics.

6. A substrate bias generating circuit according to claim 1, wherein said voltge generating means is a difference voltage generating circuit connected between the first output terminal of said bias generating means and the reference potential means for generating a difference voltage between the output voltage of said bias generating means and a predetermined voltage when the absolute value of the output voltage of said bias generating means is larger than the absolute value of the predetermined voltage.

7. A substrate bias generating circuit according to claim 6, wherein said difference voltage generating circuit includes a plurality of series-connected circuit units, said circuit units each having resistive means and voltage drop means for generating a predetermined voltage drop, said voltage drop means being connected at one end to said reference potential means and at the other end to the first output terminal of said bias generating means through said resistive means for generating an output voltage from the junction between the resistive means and the voltage drop means.

8. A substrate bias generating circuit according to claim 7, wherein said voltage drop means has a depletion type MOS transistor connected at the gate thereof to the output terminal of said bias generating means.

9. A substrate bias generating circuit according to claim 6, wherein said difference voltage generating circuit includes resistance means connected at one end thereof to the first output terminal of said bias generating means, and voltage drop means, connected at one end thereof to said reference potential means and connected at the other end thereof to the other end of said resistance means, for generating a predetermined voltage drop, and generates an output voltage from the junction between said resistive means and said voltage drop means.

10. A substrate bias generating circuit according to claim 9, wherein said voltage drop means has a depletion type MOS transistor connected at the gate thereof to the first output terminal of said bias generating means.

11. A substrate bias generating circuit according to claim 6, wherein said differential voltage generating means includes resistance means connected at one end thereof to the reference potential means, and voltage drop means, connected at one end thereof to the first output terminal of said bias generating means and at the other end thereof to the other end of said resistance means, for generating a predetermined voltage drop, and generates an output voltage from the junction between the resistance means and the voltage drop means.

12. Integrated circuit substrate bias generating means comprising:
selectively operable charge pumping means connected to said substrate for changing the voltage bias level thereof;
control means for generating a control signal by comparing the voltage threshold level of a MOS transistor with a portion of said substrate voltage bias level; and
means coupling said control signal to said charge pumping means to control the operation thereof, whereby said substrate bias is maintained at a level substantially equal to a constant multiple of said MOS transistor voltage threshold level.

* * * * *